(12) United States Patent
Tsai et al.

(10) Patent No.: US 6,245,609 B1
(45) Date of Patent: Jun. 12, 2001

(54) HIGH VOLTAGE TRANSISTOR USING P+ BURIED LAYER

(75) Inventors: Jun-Lin Tsai; Ruey-Hsin Liu, both of Hsin-Chu; Jei-Feng Hwang, Chu-Pei; Kuo-Chio Liu, Hsin-Chu, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/405,060

(22) Filed: Sep. 27, 1999

(51) Int. Cl.[7] .................................................. H01L 21/00
(52) U.S. Cl. ..................... 438/234; 438/202; 438/203; 438/204; 438/205; 438/235; 438/236; 257/555; 257/556; 257/557; 257/558; 257/559; 257/560; 257/561; 257/562; 257/563; 257/564; 257/565
(58) Field of Search ...................... 438/22, 149, 202–205, 438/234–236; 257/555–565

(56) References Cited

U.S. PATENT DOCUMENTS

| | | | |
|---|---|---|---|
| 5,262,345 | * 11/1993 | Nasser et al. | 437/59 |
| 5,336,625 | * 8/1994 | Tong | 437/31 |
| 5,344,785 | 9/1994 | Jerome et al. | 437/31 |
| 5,457,062 | * 10/1995 | Keller et al. | 437/47 |
| 5,536,961 | 7/1996 | Nakagawa et al. | 257/374 |
| 5,637,889 | * 6/1997 | Groover et al. | 257/192 |
| 5,659,190 | 8/1997 | Litwin | 257/273 |
| 5,886,387 | * 8/1999 | Nishigohri et al. | 257/370 |
| 5,899,714 | * 5/1999 | Farrenkopf et al. | 438/202 |
| 5,943,564 | * 8/1999 | Chen et al. | 438/202 |
| 6,015,726 | * 1/2000 | Yoshida | 438/202 |
| 6,025,219 | * 2/2000 | Kinoshita | 438/202 |
| 6,033,945 | * 3/2000 | Hutter et al. | 438/202 |
| 6,033,947 | * 3/2000 | Cacciola et al. | 438/202 |
| 6,103,560 | * 8/2000 | Suzuki | 438/202 |

\* cited by examiner

*Primary Examiner*—Matthew Smith
*Assistant Examiner*—Granvill Lee
(74) *Attorney, Agent, or Firm*—George O. Saile; Stephen B. Ackerman

(57) ABSTRACT

A new design for a high voltage bipolar transistor is disclosed. Instead of a buried subcollector (which would be N+ in an NPN device), a buried P+ layer is used. The presence of this P+ layer results in pinch-off between itself and the bipolar base. This allows much higher breakdown voltages to be achieved. In particular, the device will not break down at the bottom of the base-collector junction which is the weak spot for conventional devices. A process for manufacturing this device is described. A particular feature of this new process is that the N type epitaxial layer that is grown over the P+ layer is only about half the thickness of its counterpart in the conventional device. The process is fully compatible with conventional BiCMOS processes and has lower cost.

8 Claims, 7 Drawing Sheets

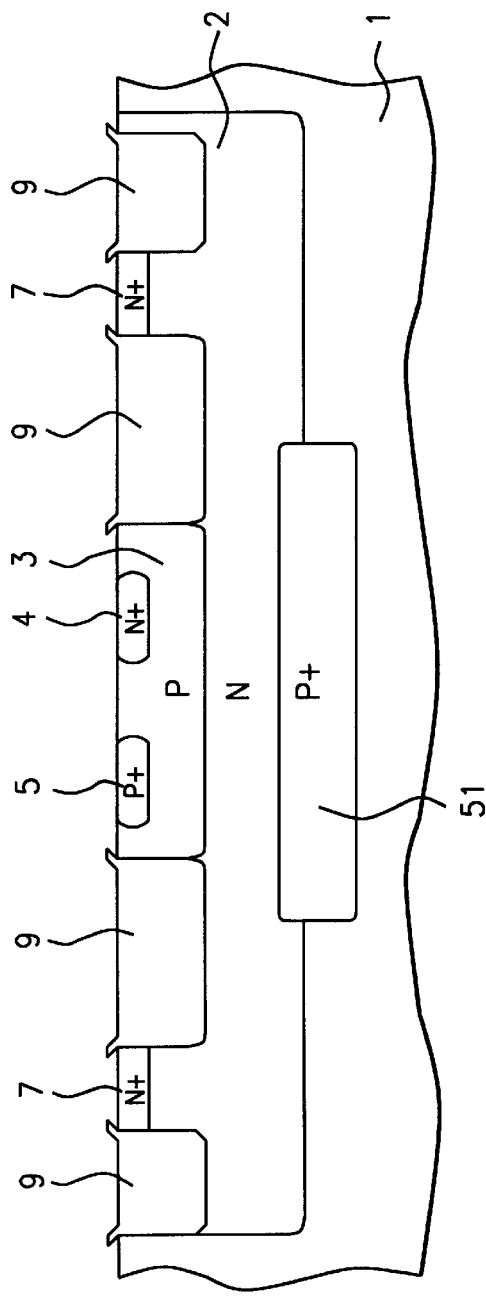
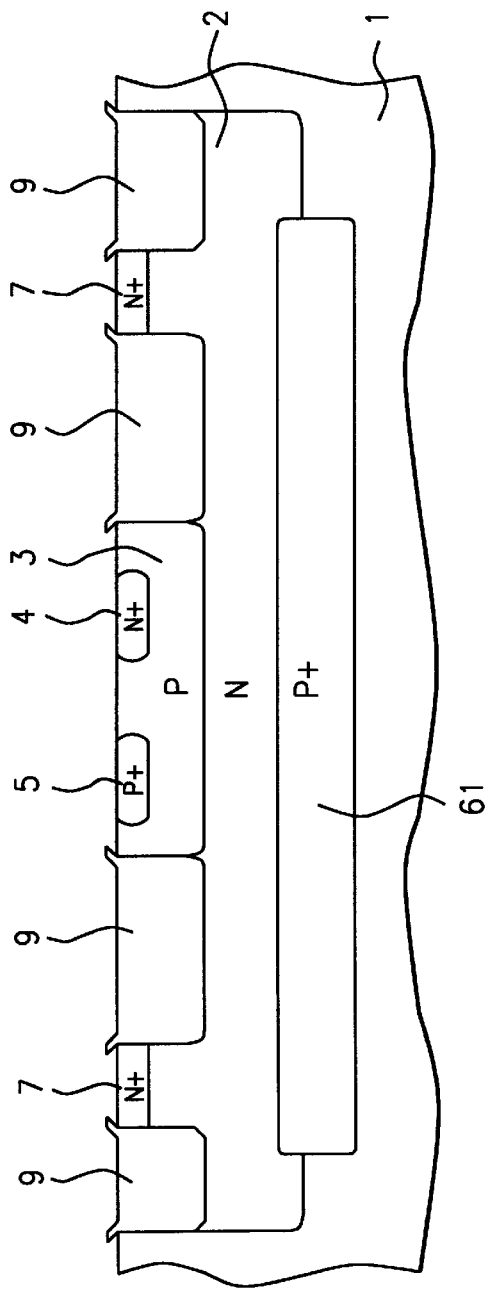
FIG. 5
FIG. 6

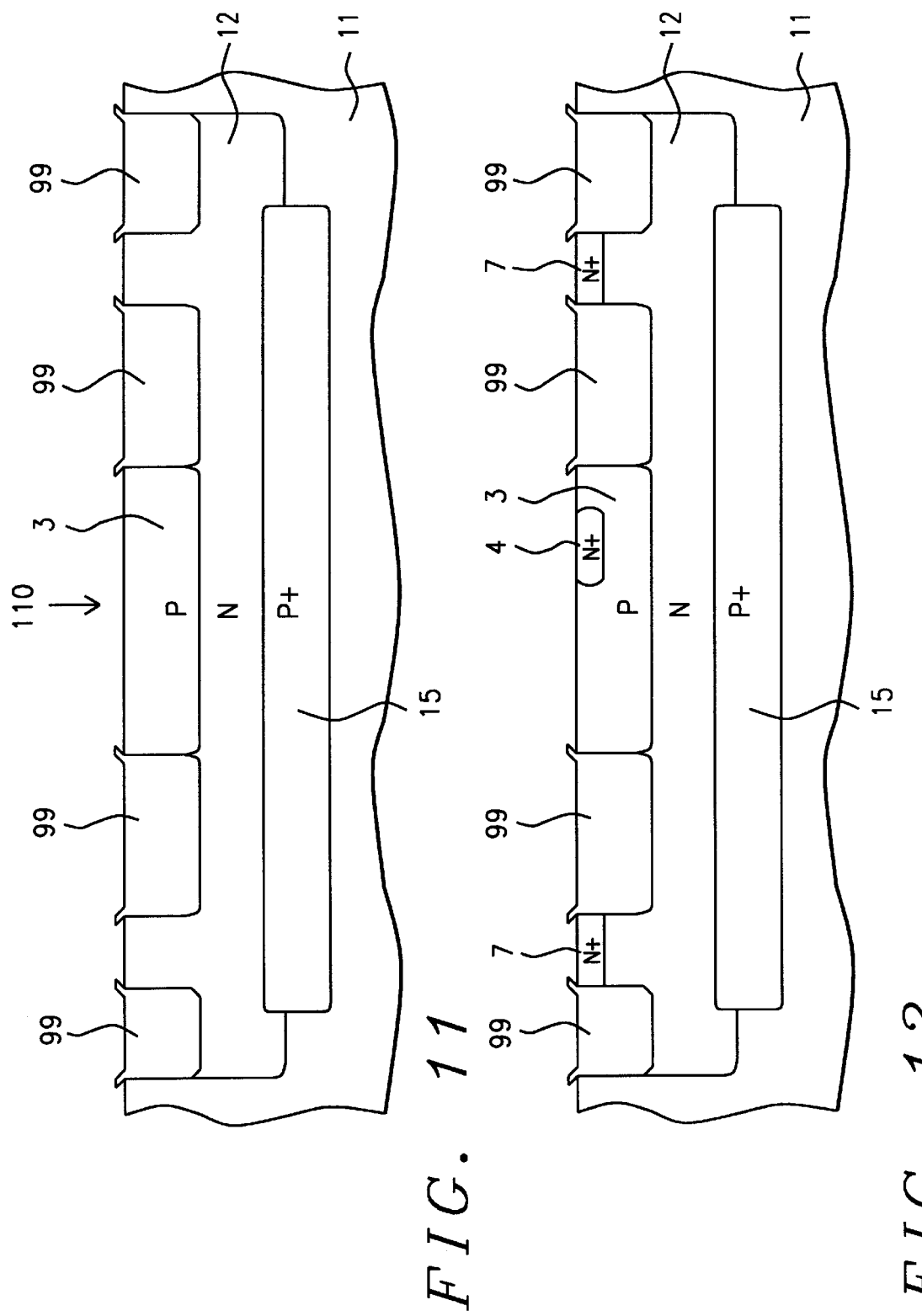

HIGH VOLTAGE TRANSISTOR USING P+ BURIED LAYER

FIELD OF THE INVENTION

The invention relates to the general field of high voltage bipolar transistors with particular reference to alternatives to SOI.

BACKGROUND OF THE INVENTION

As is well known, bipolar transistors, in their most elemental form, comprise a sandwich made up of three layers of semiconducting material, the middle layer being of an opposite conductivity type to the outer layers. Much work has been done on optimizing both the dimensions of these layers as well as determining the best way to distribute dopants within them. For the particular case of transistors that have been optimized for operation at high voltages, the form of the device is somewhat more complicated than for a 'simple' device intended to handle low voltage signals.

An example of such a device (of the prior art), for an NPN version, is illustrated in FIG. 1. Silicon body 2 may be an N type wafer or (as shown here) an N well that has been formed within silicon wafer 1. P type base layer 3 extends downward from the surface into N type silicon 2. Within 3 are both N+ emitter 4 and a P+ base contact 5, the two being separated from each other by field oxide 9. A key feature of this design is that, although 2 serves as the collector it has relatively high resistivity and therefore introduces a high series resistance to the device. This problem is overcome by the introduction of a buried subcollector 6 of N+ material that is accessed at its ends through plugs, or sinkers, 8 which are themselves contacted through the N+ regions 7. The various contact regions 4, 5, and 7 are all separated from one another by field oxide 9.

This design suffers from several disadvantages including $BV_{ceo}$ and low early voltage. A particular disadvantage is that the formation of layer 2 requires the deposition of at least 10 microns of epitaxial silicon as part of the manufacturing process. Deposition of such a thick layer can take as long as 10 minutes, thereby adding significantly to the total manufacturing cost.

An alternative design that does not require the presence of a buried collector layer is the use of silicon on insulator (SOI) technology, an example of which is shown in FIG. 2. In this design, the main components of the device are the same as in the previous example with layer 22 serving as the collector, contacted through N+ region 7. Surrounding the entire device is insulating layer 21 which is itself embedded within silicon wafer 1. This approach, while effective, is significantly more expensive than more conventional approaches, including even the device of FIG. 1.

In FIG. 3 we show equipotential lines inside a conventional device having a $V_{EB}$ of about 0.7 volts and a $V_{BC}$ of about 8 volts. As can be seen, in the general area pointed to by arrow 31, the equipotential lines are more crowded together, indicating a high voltage gradient and, therefore, the area in which voltage breakdown will occur first.

FIG. 4 shows curve 41 which plots collector current as a function of collector voltage, showing that breakdown occurs at about 10 volts for the conventional structure.

In the course of searching the prior art, no references that teach the structure and process of the present invention were found. A number of references of interest were, however, encountered. Two examples of SOI technology that we found were Jerome et al. (U.S. Pat. No. 5,344,785) who disclose a high-speed, high voltage fully isolated bipolar transistor on an insulating substrate and U.S. Pat. No. 5,536,961 in which Nakagawa el. teach the use of dielectric isolation as a means to increase breakdown voltage, their device including high and low resistance lateral sections.

Litwin (U.S. Pat. No. 5,659,190) takes a somewhat different approach and uses a combination of a bipolar and a field effect transistor to improve breakdown voltage, showing how the two devices can be combined to fit in a small space.

SUMMARY OF THE INVENTION

It has been an object of present invention to provide a bipolar transistor having a high breakdown voltage.

Another object of the invention has been that said bipolar transistor not require the use of SOI technology.

A further object of the invention has been to provide a process for manufacturing said high voltage bipolar transistor.

A still further object of the invention has been that said process have a cost that is equal to or less than the cost of manufacturing comparable devices using the present state-of-the-art.

These objects have been achieved by providing a device in which, instead of a buried subcollector (which would be N+ in an NPN device), a buried P+ layer is used. The presence of this P+ layer results in pinch-off between itself and the bipolar base. This allows much higher breakdown voltages to be achieved. In particular, the device will not break down at the bottom of the base-collector junction which is the weak spot of conventional devices. A process for manufacturing this device is described. A particular feature of this new process is that the N type epitaxial layer that is grown over the P+ layer is only about half the thickness of its counterpart in the conventional device. The process is fully compatible with conventional BiCMOS processes and has lower cost.

BRIEF DESCRIPTION OF THE DRAWINGS

FIG. 5 shows a device of the present invention, including a buried P+ layer instead of the conventional buried subcollector.

FIG. 6 shows a preferred alternative embodiment of the present invention.

FIGS. 10–13 Illustrate successive steps in the manufacture of the device of the present invention.

DESCRIPTION OF THE PREFERRED EMBODIMENTS

Figure 1:
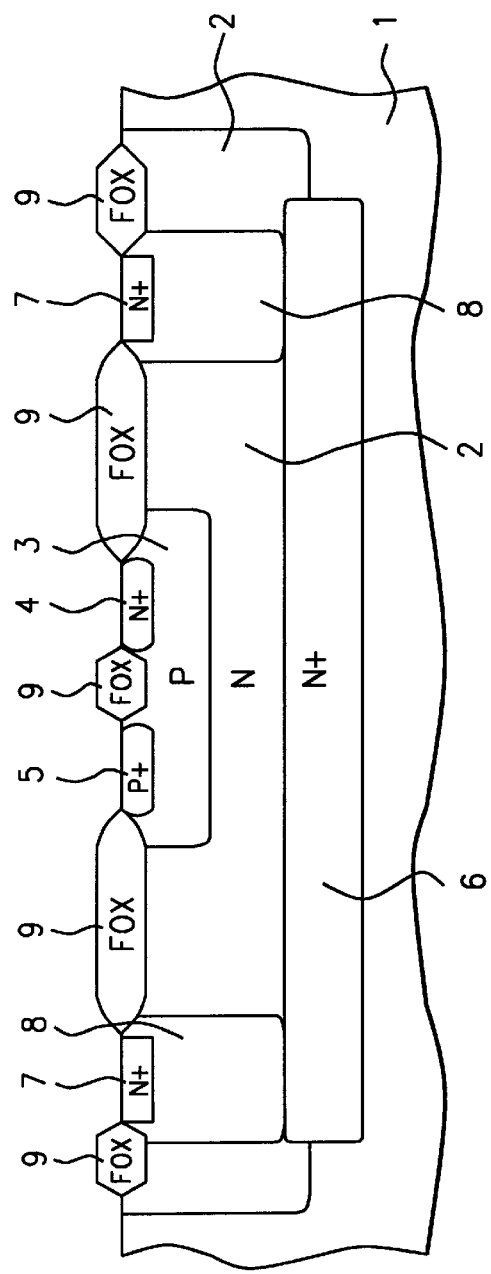
FIG. 1 shows a high voltage transistor of the prior art, including a buried subcollector for the purpose of reducing series resistance.
Figure 2:
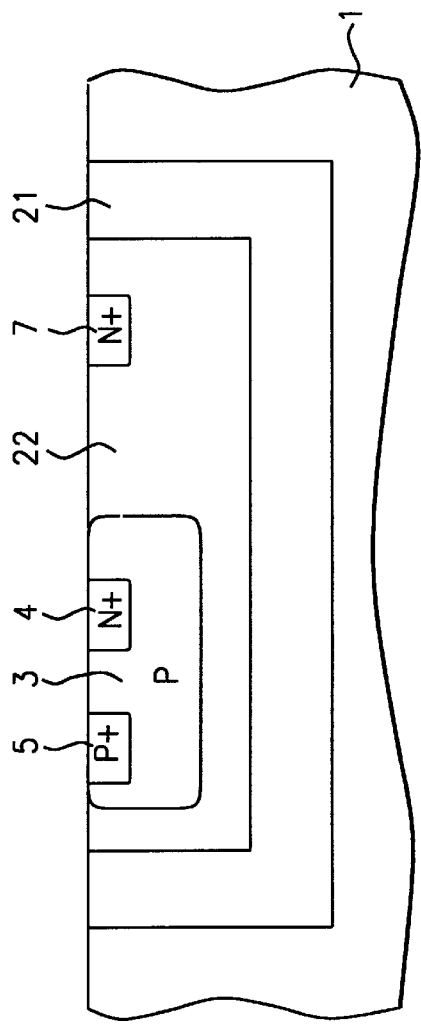
FIG. 2 shows a high voltage transistor formed by using SOI technology.
Figure 3:
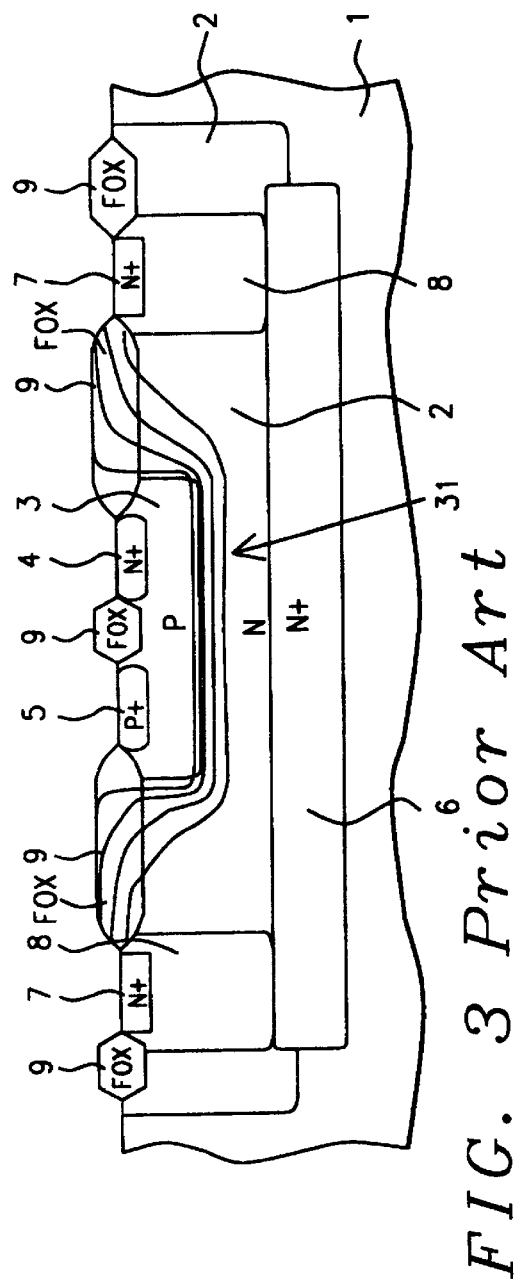
FIG. 3 shows the equipotential lines present in a high voltage transistor of the prior art illustrating the weak spot where breakdown is about to occur.

A cross-section of a high voltage transistor, built according to the design practices of the present invention, is illustrated in FIG. 5. As in the conventional structure, the upper surface of the device contains a P type base 3 that extends downward into an N well 2. Contact to base 3 is made through P+ layer 5 which. Contact to the N well, which is also the collector, is made through N+ contacts 7, separated from the other high conductivity regions by shallow isolation trenches 9.

In a major departure from the prior art, instead of an N+ subcollector, a P+ buried layer 51 is located beneath base layer 3. The preferred separation between layers 3 and 51 is about 1.5 microns, but any distance in the range between about 1 and 2 microns would still work. The typical thickness of layer 51 is about 3 microns but any thickness in the range of between about 2.5 and 4 microns would still be acceptable. The resistivity of layer 51 corresponds to a carrier density of between about $5.5 \times 10^{18}$ and $1 \times 10^{19}$ ions/cm$^3$.

As shown in FIG. 5, P+ buried layer 51 extends slightly beyond the vertical edges of base region 3, typically by between about 1.5 and 2 microns. In FIG. 6 we show a preferred alternate embodiment of the invention in which the P+ buried layer 61 extends in both directions so as to fully overlap collector contacts 7 by between about 1 and 1.5 microns. The main difference between this embodiment and that illustrated in FIG. 5 is in the application. When layer 2 is less than 4 microns, the structure of FIG. 5 is preferred while FIG. 6 is preferred when layer 2 is thicker than about 5 microns. Depending on the intended application, either version of the invention might be used, but this embodiment has the advantage that breakdown occurs at the P+ buried layer and N well boundary.

Figures 7, 8:
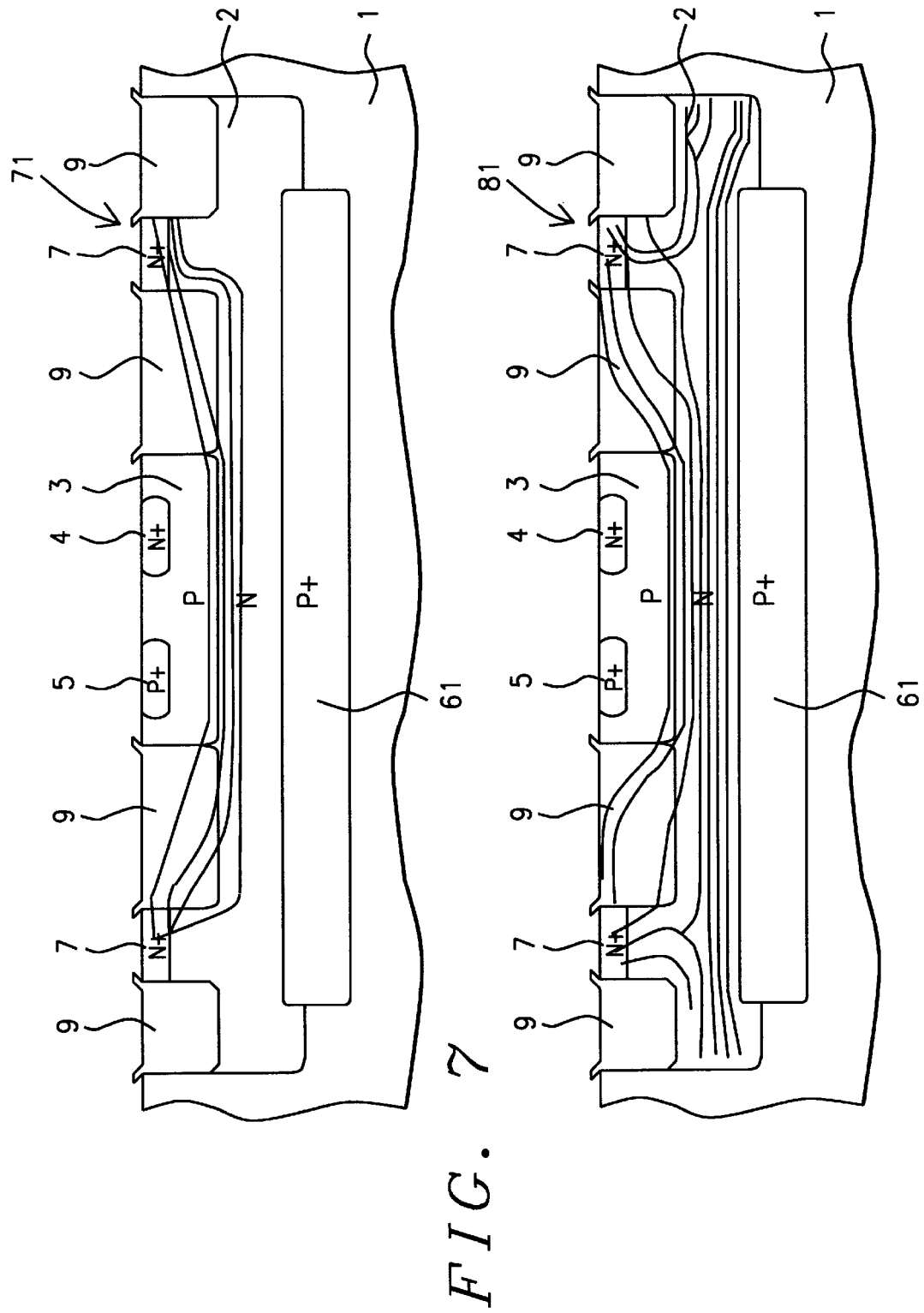
FIGS. 7 and 8 show equipotential lines for two different applied voltages in the device of the present invention illustrating that the weak spot for breakdown has been moved to a less sensitive location.

As will be shown below, the structures illustrated in FIGS. 5 and 6 have significantly higher breakdown voltage than conventional structures. The reason for this can best be seen by looking at FIGS. 7 and 8 which illustrate the equipotential lines present when voltage is applied. FIG. 7 is the case when the emitter-base voltage ($V_{BE}$) was 0.7 volts and $V_{eb}$ was 6V, while FIG. 8 is for a $V_{BE}$ of 0.7 volts and $V_{eb}$ 20V. in FIG. 7, arrow 71 points to the region of highest voltage gradient while in FIG. 8 arrow 81 shows how the equipotential line is filled between the base region and the P+ buried layer. When $V_{cb}$ increases the equipotential line is pushed out and the potential remains constant in the base region. Thus, even if $V_{cb}$ keeps increasing, the potential does not rise in the base region so breakdown does not occur at this the weakest point.

Figure 4:
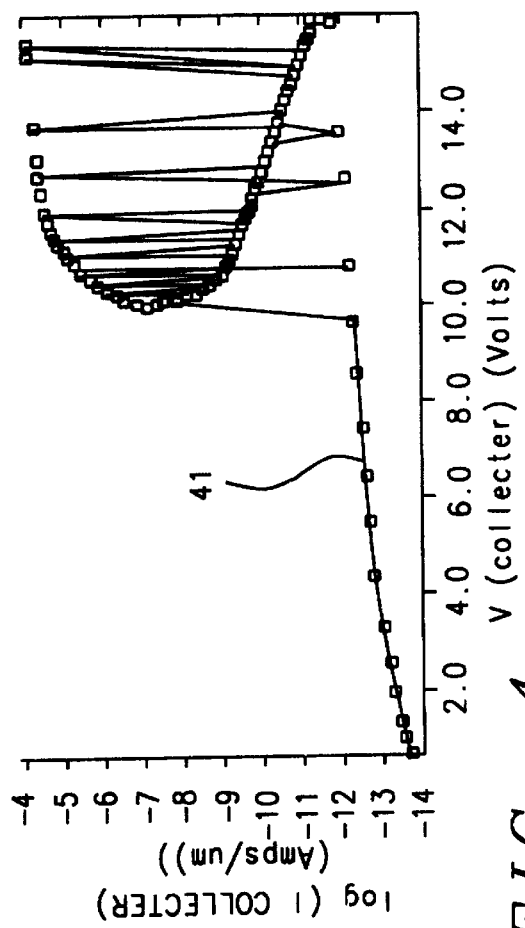
FIG. 4 is a curve of collector current vs. collector voltage for a device of the prior art.
Figure 9:
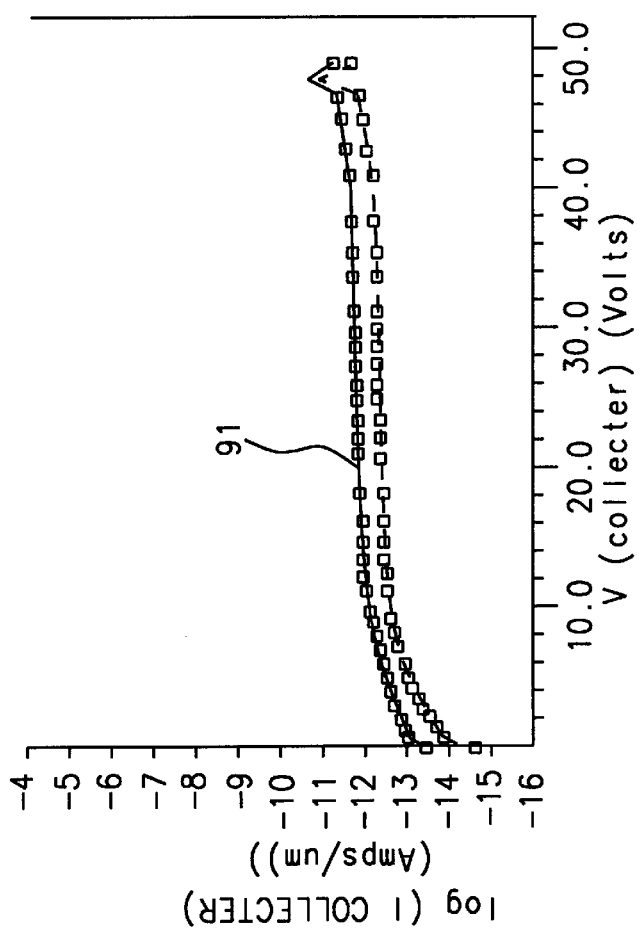
FIG. 9 is a plot of collector current vs. collector voltage for a device of the present invention, showing a significant increase in breakdown voltage.

In FIG. 9, we show curve 91 which is similar to curve 51 of FIG. 4, namely a plot of collector current as a function of collector voltage. It is readily apparent that, for the structure of the present invention, breakdown voltage has been substantially increased by a factor of about 5.

We now describe a process for the manufacture of the high voltage transistor that has been disclosed above. For purposes of simplification we have chosen to illustrate our description with the second embodiment of the device (FIG. 6) but it will be understood that this description would apply equally well to a process for manufacturing the alternate embodiment (FIG. 5) as well as to an embodiment in which the P+ buried layer had a width in between the two widths that have been formally disclosed.

Figure 10:
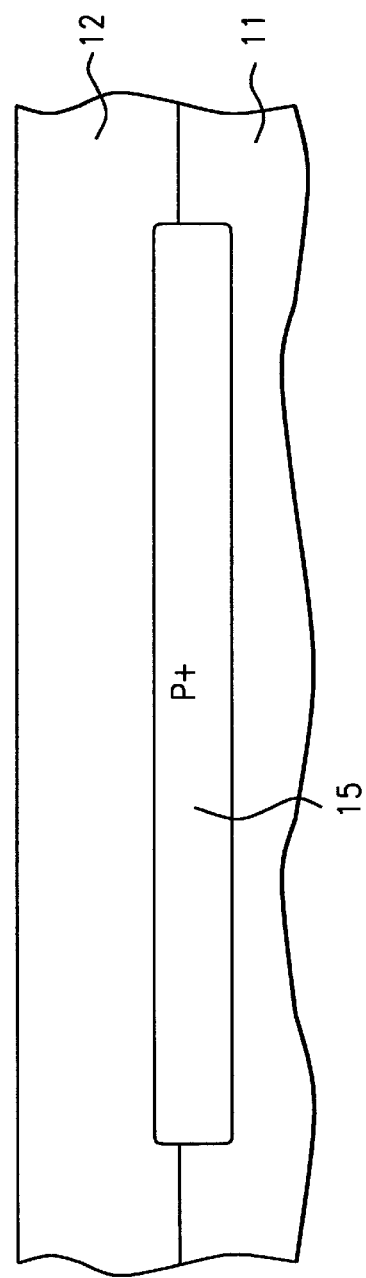

Referring now to FIG. 10, the process begins with the provision an N type silicon wafer 11 in whose upper surface acceptor ions have been implanted through a mask to form P+ layer 15, followed by a drive-in diffusion (heating at a temperature between about 950 and 1,000° C. for between about 120 and 150 minutes). This is followed by the deposition, by means of epitaxial growth, of N type layer 12. In an important feature of the invention, layer 12 is typically between about 4 and 5 microns thick, with about 4 microns being preferred. As noted earlier, the epitaxial deposition (of N type material) that forms part of the process of the prior art, generally involves layers that are 10 microns or more thick.

Next, shallow isolation trenches 99 are formed on the surface of 12, as shown in FIG. 11. These serve to delineate the outer dimensions of the device as well as base opening 110. The trenches were formed to a thickness between about 0.3 and 0.4 microns. Using a suitable mask, acceptor ions are then implanted through base opening 110 to form P type base region 3, followed by a rapid thermal anneal to activate the implanted ions. The base region depth was between about 0.3 and 0.4 microns and the acceptor species were selected from the group consisting of boron and boron fluoride. During implantation, the acceptor ions had energies between about 30 and 40 keV and were implanted at a dosage level between about $3 \times 10^{13}$ and $5 \times 10^{13}$ ions/cm$^2$.

Using a separate mask (not shown), N+ regions 4 and 7 are then formed using ion implantation, or diffusion, or ion implantation followed by diffusion. The collector contact depth was between about 0.15 and 0.2 microns while the base contact depth was between about 0.2 and 0.25 microns. This is illustrated in FIG. 12.

Figure 13:
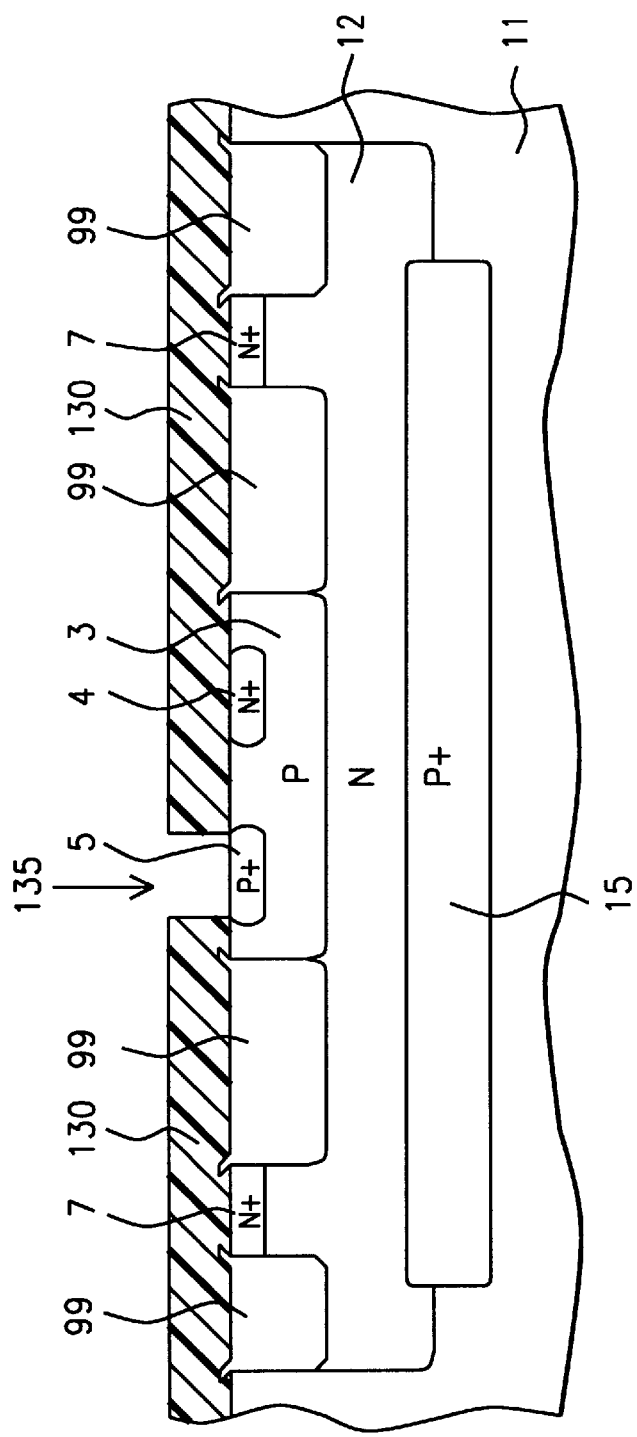

Referring now to FIG. 13, photoresist 130 is laid down and then patterned and etched to form mask 130 that covers all exposed surfaces except where a base contact is to be formed at opening 135, following which acceptor ions are implanted so as to form a P+ base contact region 5. The emitter depth was between about 0.15 and 0.2 microns.

The device is completed in the usual way including removal of the photoresist, application of metallic contacts, etc.

While the invention has been particularly shown and described with reference to the preferred embodiments thereof, it will be understood by those skilled in the art that various changes in form and details may be made without departing from the spirit and scope of the invention.

What is claimed is:

1. A process for manufacturing a high voltage bipolar transistor, comprising the sequential steps of:

providing an N type silicon wafer having an upper surface;

through a mask, ion implanting first acceptor ions to form a P+ layer extending downward from said upper surface and then heating the wafer in order to perform a drive-in diffusion;

depositing, by means of epitaxial growth, a layer of N type silicon having a thickness between about 4 and 5 microns;

forming shallow isolation trenches on said epitaxial layer which delineate the area of said high voltage transistor and provide a single base opening and two collector contact openings that underlap said P+ buried layer;

selectively implanting acceptor ions through said base opening followed by a rapid thermal anneal thereby forming a base region;

by introduction of donor ions, forming N+ regions in the collector openings and, through a mask forming an emitter region within said base region; and through a mask, ion implanting acceptor ions to form a P+ base contact region.

2. The process of claim 1 wherein said drive-in diffusion further comprises heating at a temperature between about 950 and 1,000° C. for between about 120 and 150 minutes.

3. The process of claim 1 wherein said first acceptor ions are selected from the group consisting of boron and boron fluoride.

4. The process of claim 1 wherein said first acceptor ions have energies between about 35 and 40 keV.

5. The process of claim 1 wherein said first acceptor ions are implanted at a dosage level between about $3 \times 10^{13}$ and $4 \times 10^{13}$ ions/cm$^2$.

6. The process of claim 1 wherein the step of forming N+ regions further comprises ion implantation or diffusion or ion implantation followed by diffusion.

7. The process of claim 1 wherein the shallow isolation trenches are formed to a thickness between about 0.3 and 0.4 microns.

8. The process of claim 1 wherein the P+ layer has a thickness between about 0.3 and 0.4 microns and overlaps the collector contacts.

* * * * *